(12) United States Patent
Kamineni et al.

(10) Patent No.: US 10,916,470 B2
(45) Date of Patent: Feb. 9, 2021

(54) MODIFIED DIELECTRIC FILL BETWEEN THE CONTACTS OF FIELD-EFFECT TRANSISTORS

(71) Applicant: GLOBALFOUNDRIES Inc., Grand Cayman (KY)

(72) Inventors: Vimal K. Kamineni, Mechanicville, NY (US); Ruilong Xie, Niskayuna, NY (US); Kangguo Cheng, Schenectady, NY (US); Adra V. Carr, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/290,178

(22) Filed: Mar. 1, 2019

(65) Prior Publication Data

US 2020/0279768 A1    Sep. 3, 2020

(51) Int. Cl.

| H01L 21/00 | (2006.01) |
| H01L 21/768 | (2006.01) |
| H01L 23/532 | (2006.01) |
| H01L 21/8234 | (2006.01) |
| H01L 29/78 | (2006.01) |

(52) U.S. Cl.
CPC .... *H01L 21/76802* (2013.01); *H01L 21/7685* (2013.01); *H01L 21/76834* (2013.01); *H01L 21/76835* (2013.01); *H01L 23/53209* (2013.01); *H01L 23/53295* (2013.01); *H01L 21/823475* (2013.01); *H01L 29/785* (2013.01)

(58) Field of Classification Search
CPC ......... H01L 21/76802; H01L 21/76834; H01L 21/76835
See application file for complete search history.

(56) References Cited

U.S. PATENT DOCUMENTS

| 9,385,080 | B2* | 7/2016 | Lin | H01L 21/28518 |
| 9,589,892 | B2* | 3/2017 | Lin | H01L 21/76897 |
| 9,722,038 | B2* | 8/2017 | Adusumilli | H01L 21/28088 |
| 9,941,278 | B2* | 4/2018 | Labonte | H01L 29/785 |
| 10,121,875 | B1* | 11/2018 | Ho | H01L 27/0922 |
| 10,685,873 | B2* | 6/2020 | Tung | H01L 23/5329 |
| 10,741,669 | B2* | 8/2020 | Leib | H01L 23/5226 |
| 2016/0049362 | A1* | 2/2016 | Lin | H01L 21/76897 257/751 |
| 2016/0268192 | A1* | 9/2016 | Lin | H01L 21/76834 |
| 2017/0077256 | A1* | 3/2017 | Adusumilli | H01L 29/6656 |
| 2018/0005876 | A1* | 1/2018 | Tung | H01L 21/76802 |
| 2018/0012887 | A1* | 1/2018 | Labonte | H01L 21/823475 |
| 2018/0122706 | A1* | 5/2018 | Cheng | H01L 29/66666 |
| 2018/0350666 | A1* | 12/2018 | Tung | H01L 21/76802 |
| 2019/0164748 | A1* | 5/2019 | Chou | H01L 21/76895 |
| 2020/0006059 | A1* | 1/2020 | Chou | H01L 21/31116 |
| 2020/0066630 | A1* | 2/2020 | Bao | H01L 23/5283 |

\* cited by examiner

*Primary Examiner* — Laura M Menz
(74) *Attorney, Agent, or Firm* — Thompson Hine LLP; Francois Pagette

(57) ABSTRACT

Structures that include a field effect-transistor and methods of forming a structure that includes a field-effect transistor. A first field-effect transistor includes a first source/drain region, and a second field-effect transistor includes a second source/drain region. A first contact is arranged over the first source/drain region, and a second contact is arranged over the second source/drain region. A portion of a dielectric layer, which is composed of a low-k dielectric material, is laterally arranged between the first contact and the second contact.

20 Claims, 15 Drawing Sheets

MODIFIED DIELECTRIC FILL BETWEEN THE CONTACTS OF FIELD-EFFECT TRANSISTORS

BACKGROUND

The present invention relates to semiconductor device fabrication and integrated circuits and, more specifically, to structures that include a field effect-transistor and methods of forming a structure that includes a field-effect transistor.

Complementary-metal-oxide-semiconductor (CMOS) processes may be used to build a combination of p-type and n-type field-effect transistors that are used to construct, for example, logic cells. Field-effect transistors generally include a body providing a source, a drain, a body between the source and the drain, and a gate electrode over the body. When a control voltage exceeding a characteristic threshold voltage is applied to the gate electrode, carrier flow occurs in a channel region generated in the body between the source and drain to produce a device output current.

A fin-type field-effect transistor (FinFET) is a non-planar device structure that may be more densely packed in an integrated circuit than planar field-effect transistors. A fin-type field-effect transistor may include a fin consisting of a body of semiconductor material, a gate structure that wraps about the fin, and heavily-doped source/drain regions arranged on opposite sides of the gate structure.

Contacts may provide vertical electrical connections extending to features of semiconductor devices, such as the gate electrode and source/drain regions of the field-effect transistor. Self-aligned contacts are formed in contact openings that are constrained during etching by the configuration of adjacent structures, such as sidewall spacers and gate caps associated with the gate electrodes, as opposed to being constrained by a patterned resist.

An interlayer dielectric layer is formed that provides gap fill of spaces around the field-effect transistor. The contact openings for the source/drain regions are initially filled by sections of the interlayer dielectric layer. These sections of the interlayer dielectric layer are removed to open the contact openings for formation of the self-aligned contacts. Other sections of the interlayer dielectric layer remain in the space about the field-effect transistor, such as the spaces over trench isolation regions. In conventional device structures, the interlayer dielectric layer is composed of silicon dioxide having a dielectric constant that may effectively hinder the performance characteristics of the field-effect transistor.

Improved structures that include a field effect-transistor and methods of forming a structure that includes a field-effect transistor are needed.

SUMMARY

In an embodiment of the invention, a structure includes a first field-effect transistor having a first source/drain region, a second field-effect transistor having a second source/drain region, a first contact over the first source/drain region, and a second contact over the second source/drain region. The structure further includes a dielectric layer having a portion laterally arranged between the first contact and the second contact. The dielectric layer is composed of a low-k dielectric material.

In an embodiment of the invention, a method includes forming a first source/drain region of a first field-effect transistor, forming a second source/drain region of a second field-effect transistor, forming a first contact arranged over the first source/drain region and a second contact arranged over the second source/drain region, and forming a dielectric layer that includes a portion laterally arranged between the first contact and the second contact. The dielectric layer is composed of a low-k dielectric material.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
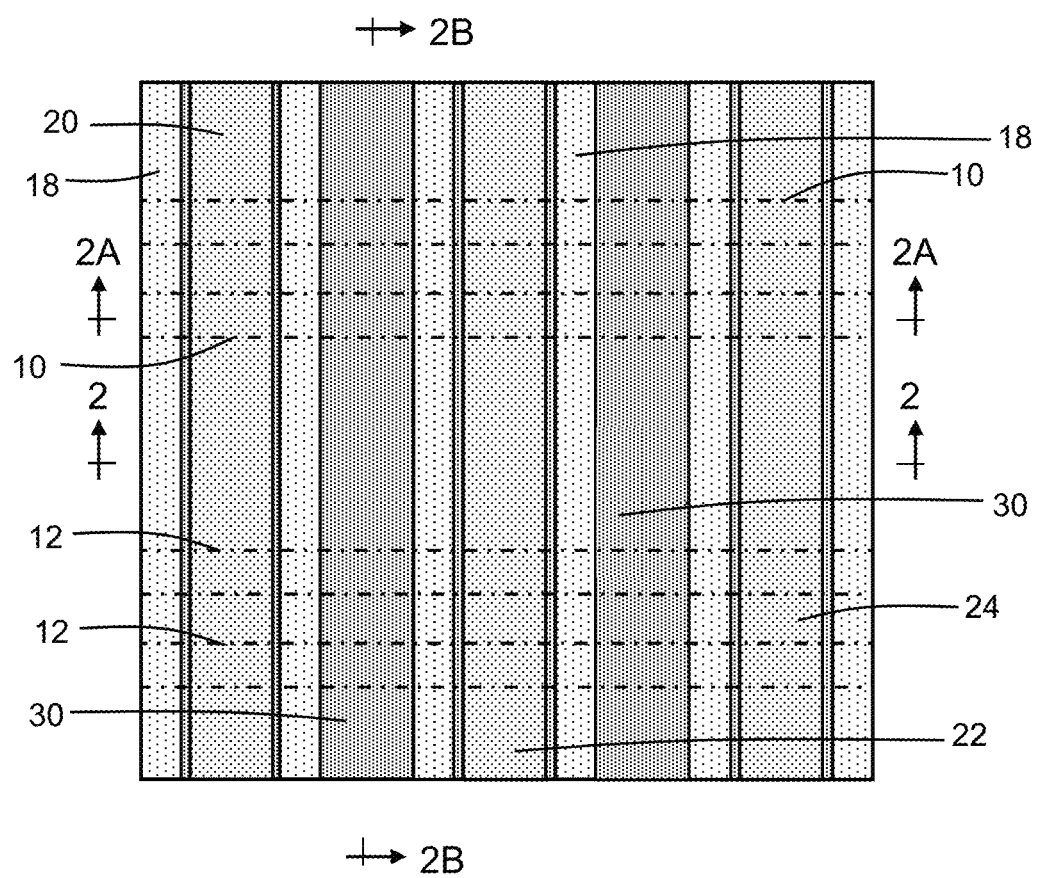
FIG. 1 is a top view of a structure at an initial fabrication stage of a processing method in accordance with embodiments of the invention.

With reference to FIGS. 1, 2, 2A, 2B and in accordance with embodiments of the invention, semiconductor fins 10, 12 are formed that project upwardly from a substrate 14. The semiconductor fins 10, 12 may be formed by patterning the single-crystal semiconductor material (e.g., single-crystal silicon) of the substrate 14 with lithography and etching processes, and may include cuts that provide a layout associated with the specific device structures being formed and their arrangement. A trench isolation region 16 is formed that operates to electrically isolate the semiconductor fins 10, 12 from each other. The trench isolation region 16 may be formed by depositing a layer composed of a dielectric material, such as silicon dioxide, by chemical vapor deposition, and recessing the deposited layer with an etching process to expose an upper portion of each of the semiconductor fins 10, 12. The respective lower portions of the semiconductor fins 10, 12 are embedded in, and surrounded by, the trench isolation region 16.

Gate structures 20, 22, 24 are formed that include sections that extend lengthwise over the semiconductor fins 10, 12 and other sections that extend lengthwise across the space over the trench isolation region 16 between the semiconductor fins 10 and the semiconductor fins 12. Each of the gate structures 20, 22, 24 may include a gate electrode 21 and a gate dielectric layer 23 that is arranged in part between the gate electrode 21 and the semiconductor fins 10, 12. The gate electrode 21 may include one or more conformal barrier metal layers and/or work function metal layers, such as layers composed of titanium aluminum carbide and/or titanium nitride, and a metal gate fill layer composed of a metal, such as tungsten. The gate dielectric layer 23 may be contain a dielectric material, such as a high-k dielectric material like hafnium oxide.

Sidewall spacers 18 are arranged adjacent to the sidewalls of each of the gate structures 20, 22, 24. The sidewall spacers 18 may be composed of a low-k dielectric material, such as SiOCN, that is deposited and etched with an anisotropic etching process, such as reactive ion etching.

Semiconductor layers 26 are epitaxially grown from the semiconductor fins 10 by an epitaxial growth process, and semiconductor layers 28 are epitaxially grown from the semiconductor fins 12 by a different epitaxial growth process. In an embodiment, the epitaxial semiconductor layers 26 may contain silicon-germanium doped during epitaxial growth with a p-type dopant (e.g., boron, aluminum, gallium, and/or indium) that provides p-type electrical conductivity, and the epitaxial semiconductor layers 28 may contain silicon doped during epitaxial growth with an n-type dopant (e.g., phosphorus and/or arsenic) that provides n-type electrical conductivity. Due to lateral growth during the respective epitaxial growth processes, portions of the epitaxial semiconductor layers 26 are arranged in cavities etched in the semiconductor fins 10 between the gate structures 20, 22, 24, and portions of the epitaxial semiconductor layers 28 are arranged in cavities etched in the semiconductor fins 12 between the gate structures 20, 22, 24. The epitaxial semiconductor layers 26 furnish source/drain regions for field-effect transistors formed using the semiconductor fins 10, and the epitaxial semiconductor layers 28 furnish source/drain regions for field-effect transistors formed using the semiconductor fins 12. As used herein, the term "source/drain region" means a doped region of semiconductor material that can function as either a source or a drain of a field-effect transistor.

An interlayer dielectric layer 30 is formed over the gate structures 20, 22, 24 and semiconductor fins 10, 12. Sections of the interlayer dielectric layer 30 fill the spaces over the epitaxial semiconductor layers 26, 28 between the gate structures 20, 22, 24. The interlayer dielectric layer 30 may be composed of a dielectric material, such as silicon dioxide, that is deposited by chemical vapor deposition and planarized, and that is different in composition from the dielectric material of the sidewall spacers 18.

Figure 2:
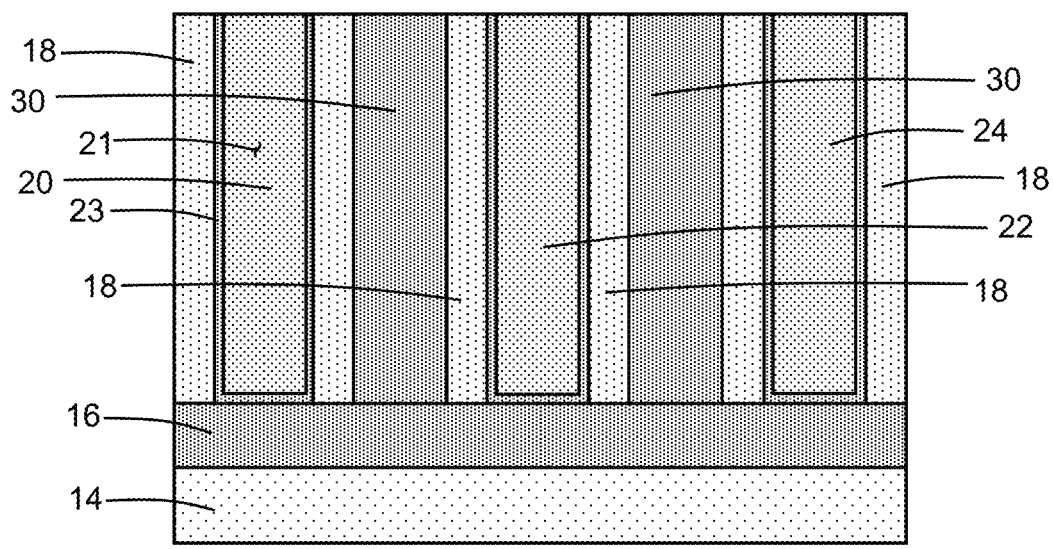
FIG. 2 is a cross-sectional view taken generally along line 2-2 in FIG. 1.
Figure 2A:
FIG. 2A is a cross-sectional view taken generally along line 2A-2A in FIG. 1.
Figure 2B:
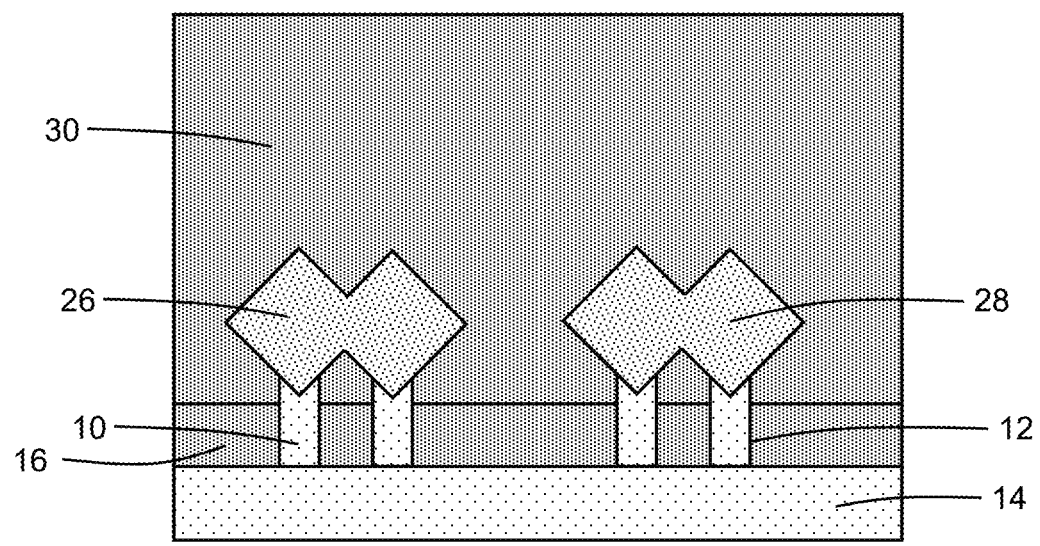
FIG. 2B is a cross-sectional view taken generally along line 2B-2B in FIG. 1.
Figure 3:
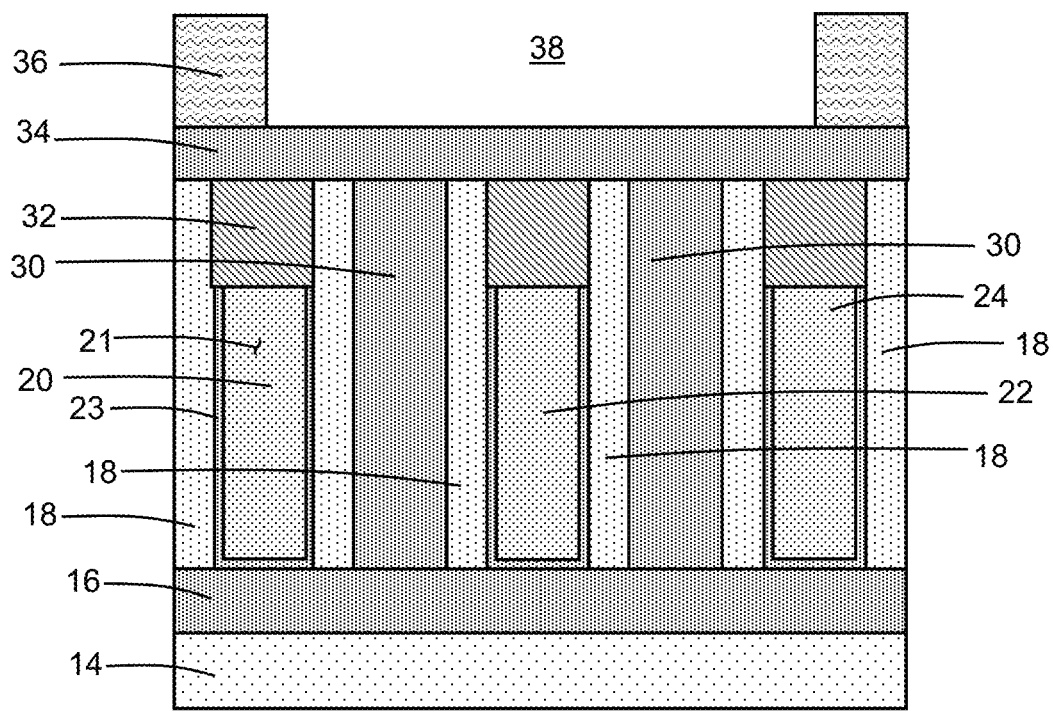
FIGS. 3-10, 3A-10A, and 3B-10B are cross-sectional views of the structure at successive fabrication stages of the processing method respectively subsequent to FIGS. 2, 2A, and 2B.
Figure 3A:
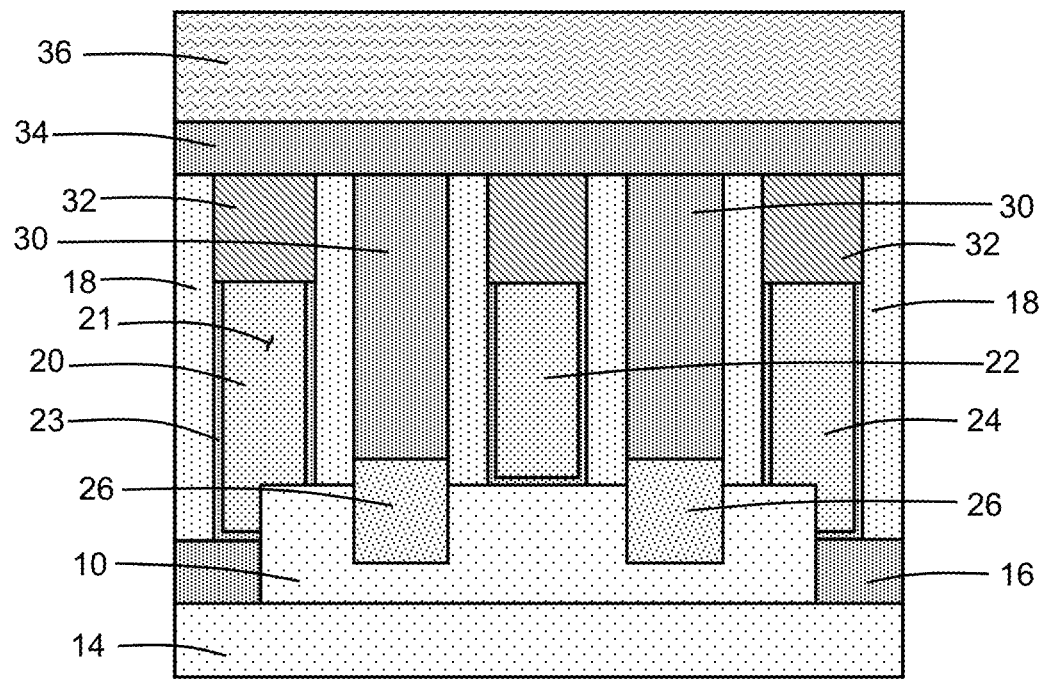
Figure 3B:
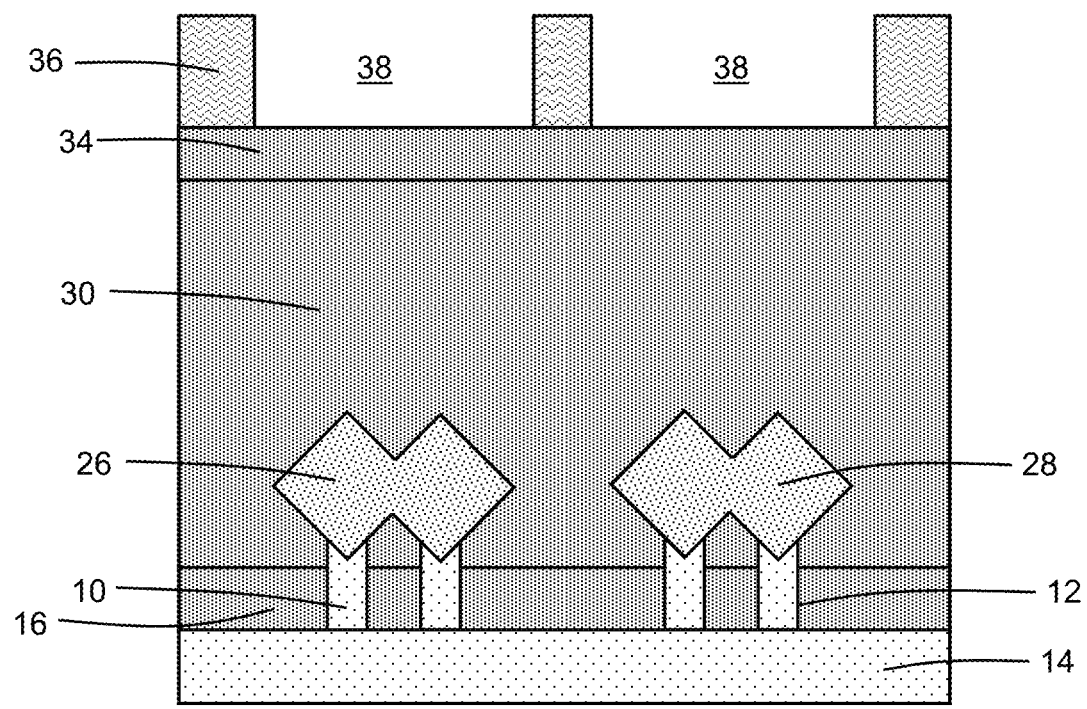

With reference to FIGS. 3, 3A, 3B in which like reference numerals refer to like features in FIGS. 2, 2A, 2B and at a subsequent fabrication stage of the processing method, gate caps 32 are formed over the gate structures 20, 22, 24. The gate caps 32 are disposed in cavities defined by recessing the gate structures 20, 22, 24 with an etching process that removes the materials of the gate structures 20, 22, 24 selective to the materials contained in the sections of the interlayer dielectric layer 30 and the sidewall spacers 18. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The gate caps 32 may be composed of a dielectric material, such as silicon nitride, that is deposited by chemical vapor deposition and then planarized with chemical-mechanical polishing.

A dielectric layer 34 is deposited, and an etch mask 36 is formed over the dielectric layer 34 by applying a lithography stack and patterning the lithography stack to generate openings 38. The etch mask 36 may include an organic planarization layer (OPL) material and an anti-reflection coating in the lithography stack that are patterned with lithography and etching processes. The dielectric layer 34 may be composed of a dielectric material, such as silicon dioxide, that is deposited by chemical vapor deposition and planarized.

Figure 4:
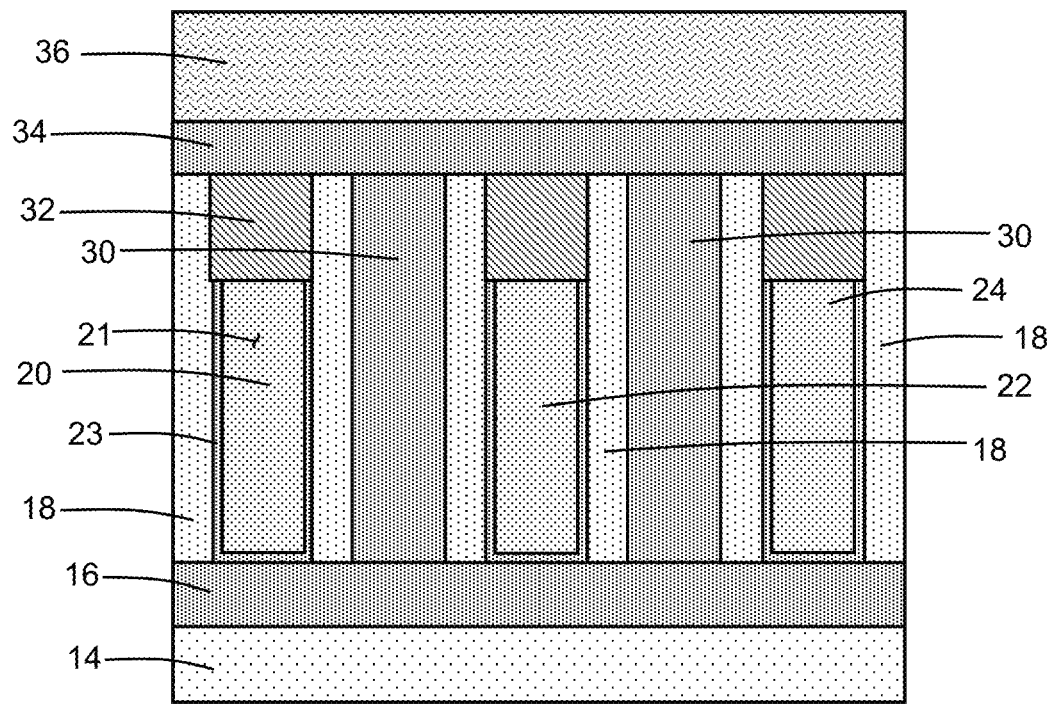
Figure 4A:
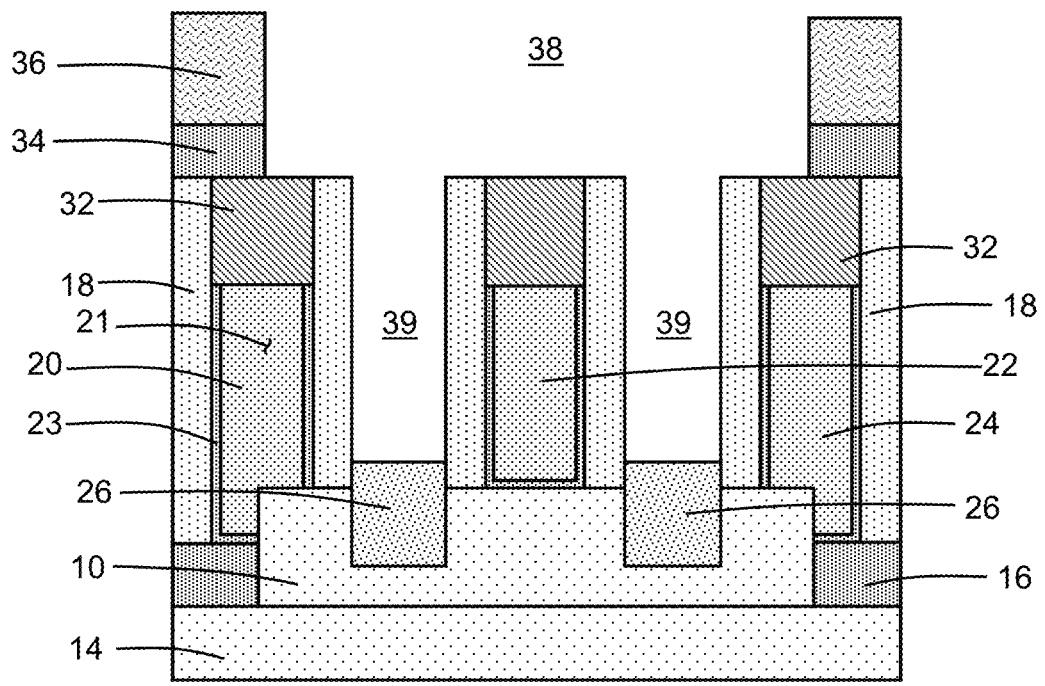
Figure 4B:
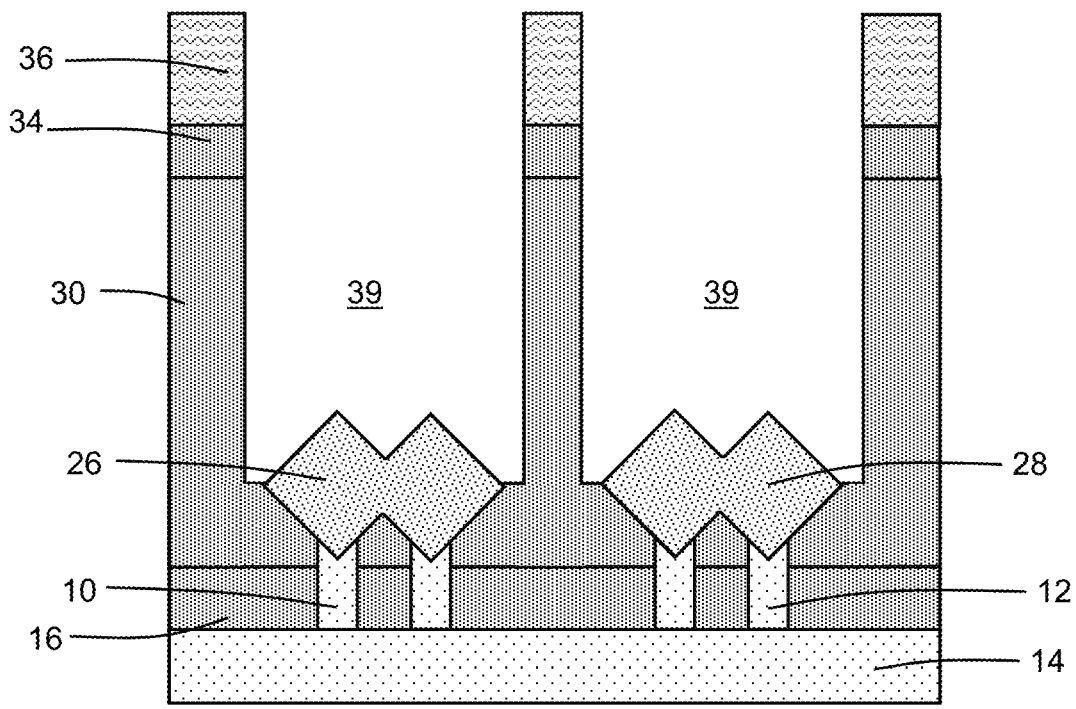

With reference to FIGS. 4, 4A, 4B in which like reference numerals refer to like features in FIGS. 3, 3A, 3B and at a subsequent fabrication stage of the processing method, portions of the dielectric layer 34 and the sections of the interlayer dielectric layer 30 over the epitaxial semiconductor layers 26, 28 are removed to form openings 39 that expose the epitaxial semiconductor layers 26, 28. The etch mask 36 covers and protects masked sections of the interlayer dielectric layer 30 that are arranged over the trench isolation region 16. The etching process removes the dielectric material of the interlayer dielectric layer 30 selective to the dielectric materials of the sidewall spacers 18 and the gate caps 32. The epitaxial semiconductor layers 26, 28 may be silicided following the etching process. Although not shown, the etching process may erode and bevel the edges of the sidewall spacers 18 and the gate caps 32 that are not masked and protected by the etch mask 36.

Figure 5:
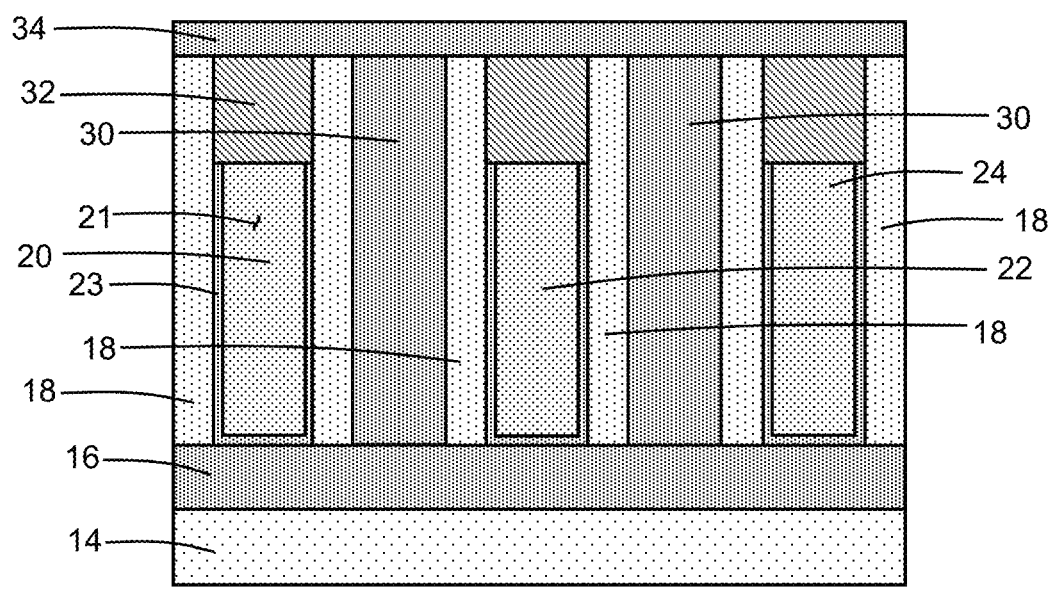
Figure 5A:
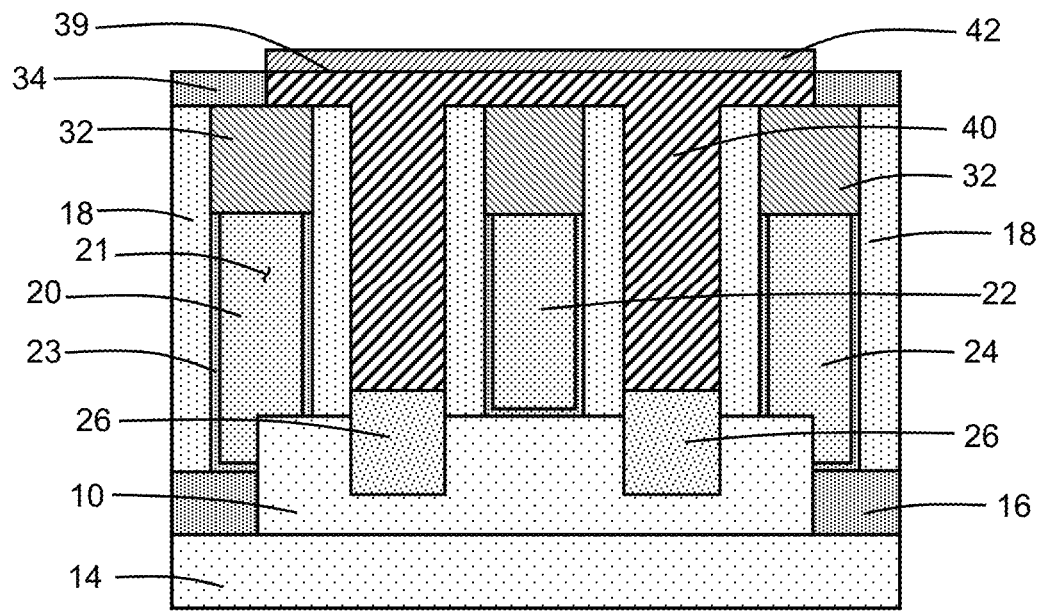
Figure 5B:
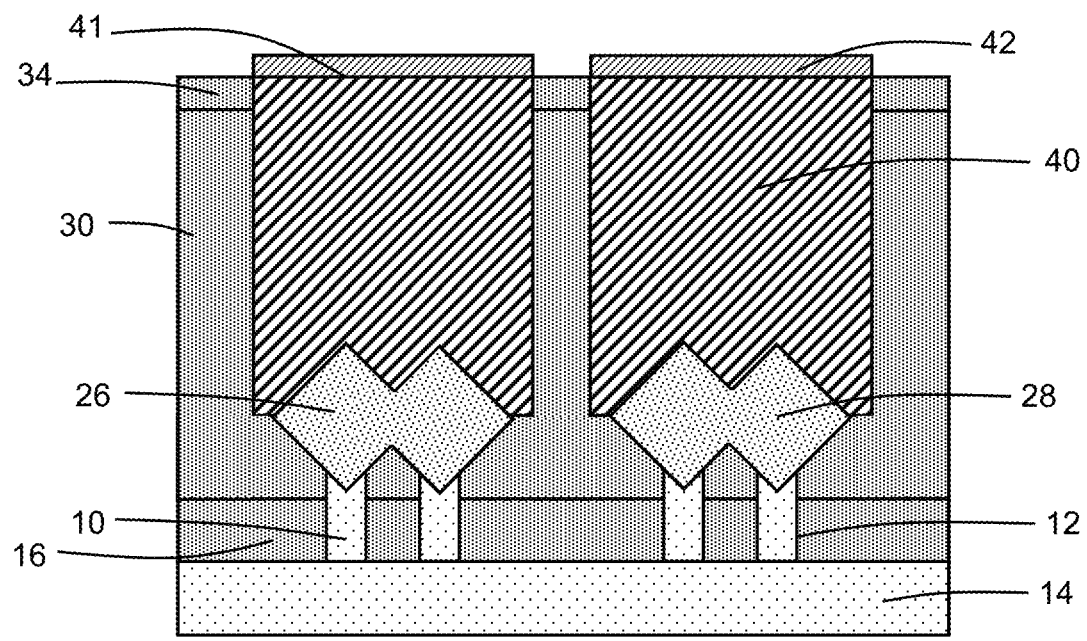

With reference to FIGS. 5, 5A, 5B in which like reference numerals refer to like features in FIGS. 4, 4A, 4B and at a subsequent fabrication stage of the processing method, the etch mask 36 is removed by, for example, ashing with an oxygen plasma. A metallization layer 40 is formed that fills the openings 39 (FIGS. 4A, 4B) generated by the removal of the sections of the interlayer dielectric layer 30. The primary conductor of the metallization layer 40 may be composed of a low-resistivity metal, such as cobalt, deposited by, for example, chemical vapor deposition. The metallization layer 40 may include a conformal barrier/liner (not shown) composed of titanium, titanium nitride, tantalum, tantalum nitride, or a layered combination of these materials (e.g., a bilayer of tantalum nitride and tantalum) that is applied to the exposed surfaces surrounding the openings 39 before filling with the primary conductor. Portions of the metallization layer 40 are in direct contact with the semiconductor layers 26, 28 or the silicide (not shown) on the semiconductor layers 26, 28.

A capping layer 42 is formed on a top surface 41 of the metallization layer 40. The capping layer 42 may be composed of a metal deposited by low-temperature chemical vapor deposition or atomic layer deposition. In an embodiment, the capping layer 42 may be composed of a different metal than the metal of the metallization layer 40. In an embodiment in which the metallization layer 40 is composed of cobalt, the capping layer 42 may be composed of tungsten. The capping layer 42 may be selectively deposited such that its material nucleates and forms on the top surface 41 of the metallization layer 40, but fails to nucleate and form on the top surface of dielectric layer 34 that surrounds the metallization layer 40. The selective deposition may be preceded and promoted by a surface treatment of the top surface 41 of the metallization layer 40.

Figure 6:
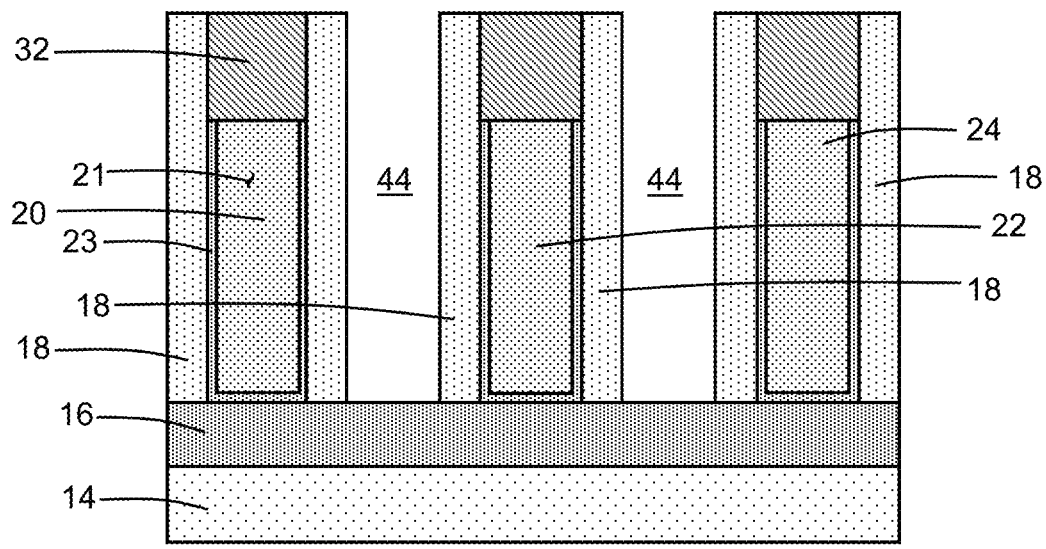
Figure 6A:
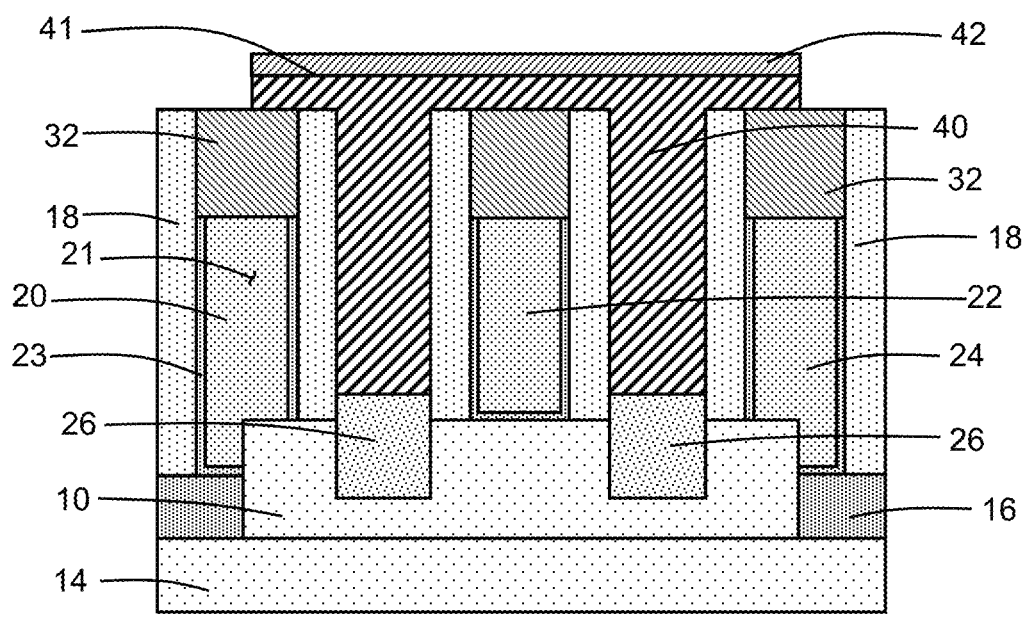
Figure 6B:
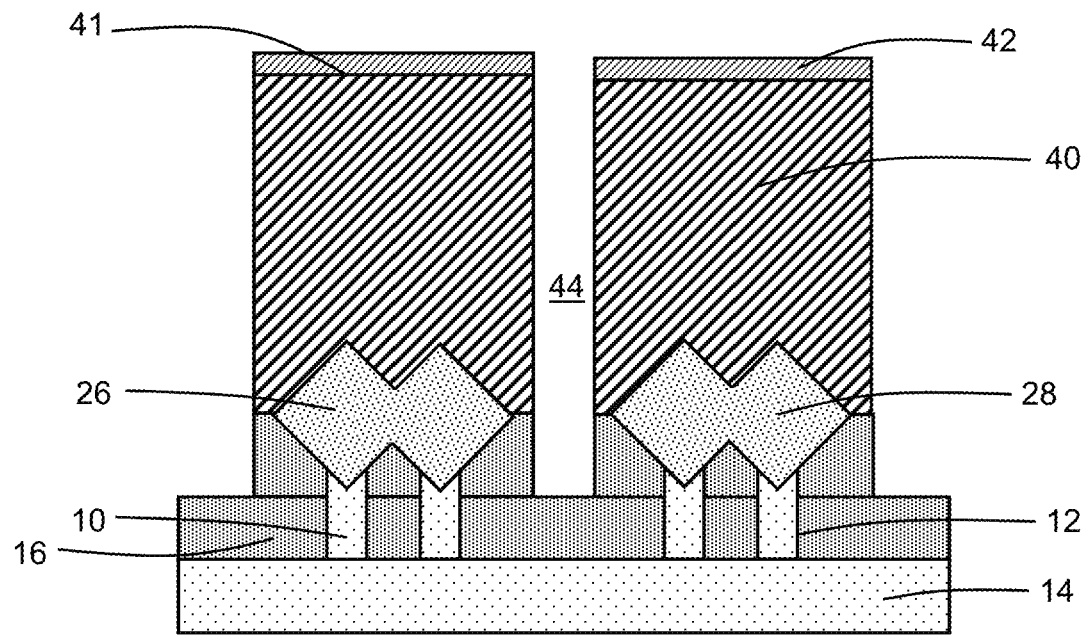

With reference to FIGS. 6, 6A, 6B in which like reference numerals refer to like features in FIGS. 5, 5A, 5B and at a subsequent fabrication stage of the processing method, the sections of the interlayer dielectric layer 30 over the trench isolation region 16 and between the gate structures 20, 22, 24 are removed with an etching process. The etching process may be an anisotropic etching process that removes the material of the interlayer dielectric layer 30 selective to the materials of the sidewall spacers 18, the gate caps 32, and the capping layer 42. Cavities 44 are formed over the trench isolation region 16 between the gate structures 20, 22, 24. The cavities 44 are also arranged between the semiconductor layers 26 associated with the semiconductor fins 10 and the semiconductor layers 28 associated with the semiconductor fins 12.

Figure 7:
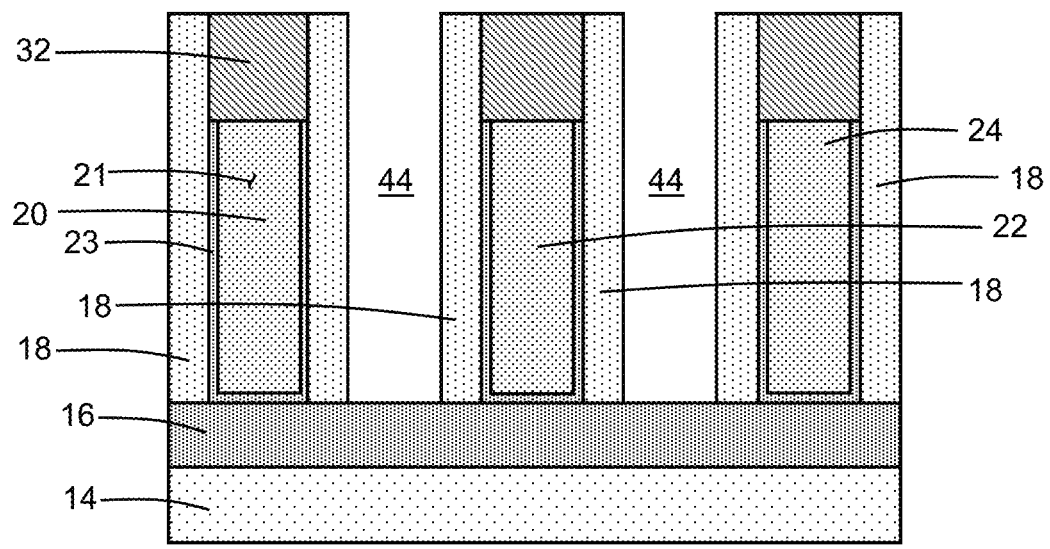
Figure 7A:
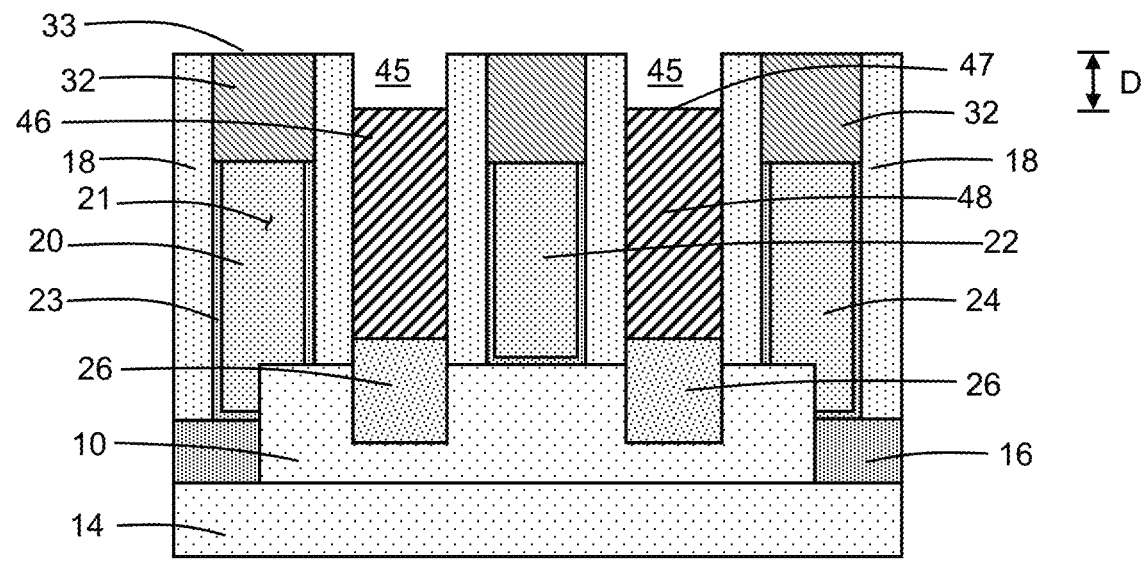
Figure 7B:
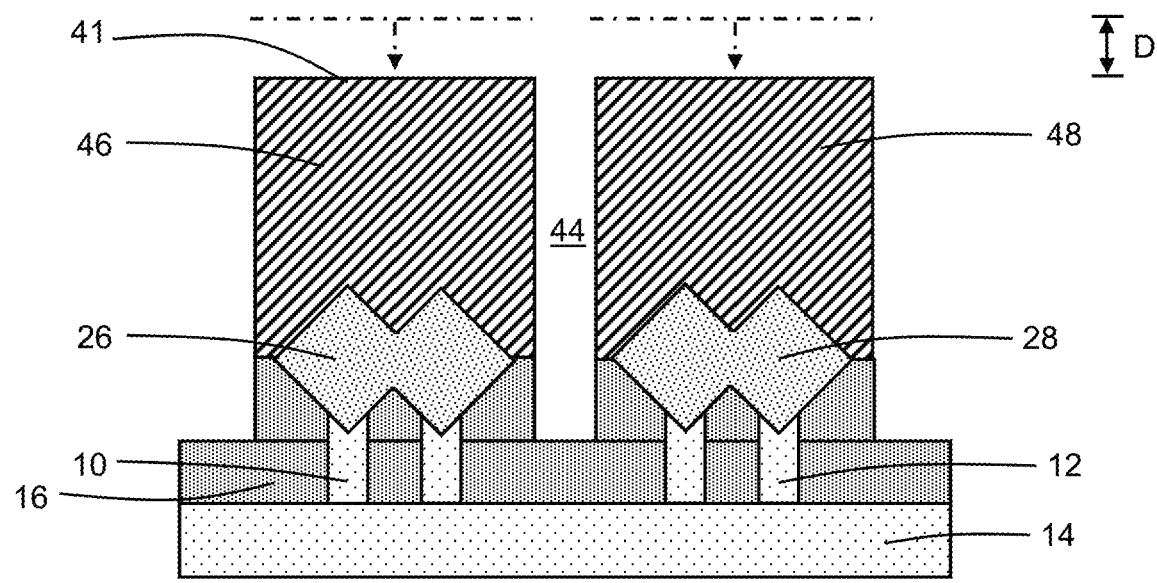

With reference to FIGS. 7, 7A, 7B in which like reference numerals refer to like features in FIGS. 6, 6A, 6B and at a subsequent fabrication stage of the processing method, the capping layer 42 is removed from the top surface 41 of the metallization layer 40 with an etching process. The removal of the capping layer 42 re-exposes the metallization layer 40. Contacts 46, 48 are formed from the metallization layer 40 with an etching process that removes the material of the metallization layer 40 selective to the materials of the trench isolation region 16, the sidewall spacers 18, and the gate caps 32. The contact 46 is connected with the semiconductor layers 26, and the contact 48 is connected with the semiconductor layers 28. The etching process removes the thickness of metallization layer 40 above the sidewall spacers 18 and the gate caps 32 such that the contact 46 is disconnected from the contact 48 and the top surface 47 of the contacts 46, 48 is coplanar with the top surface 33 of the gate caps 32.

The contacts 46, 48 are recessed relative to the gate caps 32 by continuing the etching process. Recesses 45 are formed as open spaces over the recessed contacts 46, 48 and between adjacent pairs of sidewall spacers 18. The top surface 47 of the recessed contacts 46, 48 is arranged in a vertical direction below the top surface 33 of the gate caps 32 by a distance, D, and between the top surface 33 and the semiconductor layers 26, 28. The sidewall spacers 18 project above the top surface 47 of the recessed contacts 46, 48 and upper portions of the sidewall spacers 18 laterally bound the recesses 45.

Figure 8:
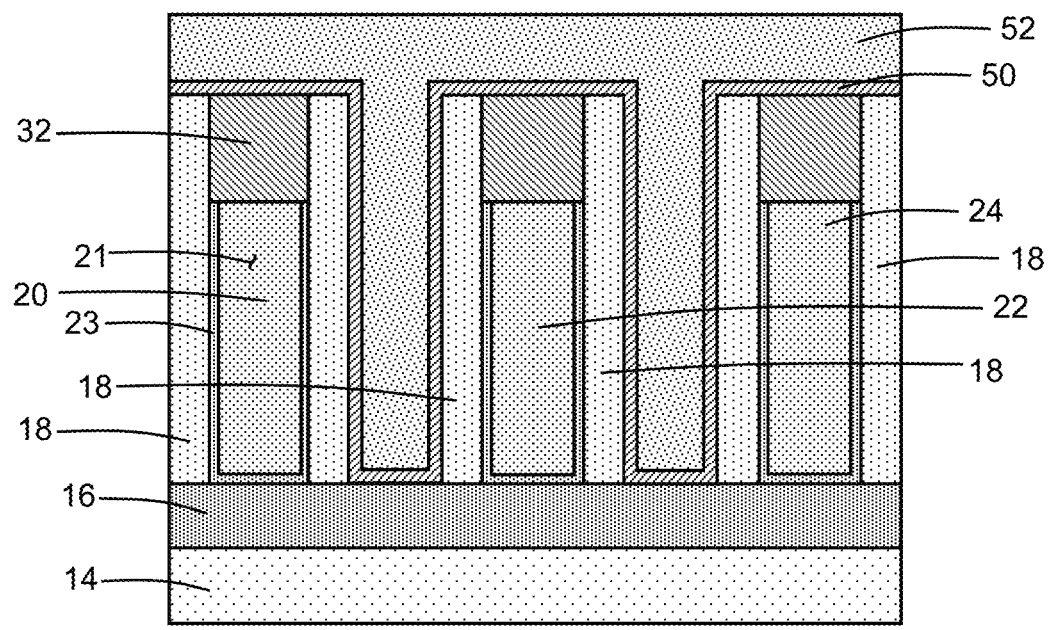
Figure 8A:
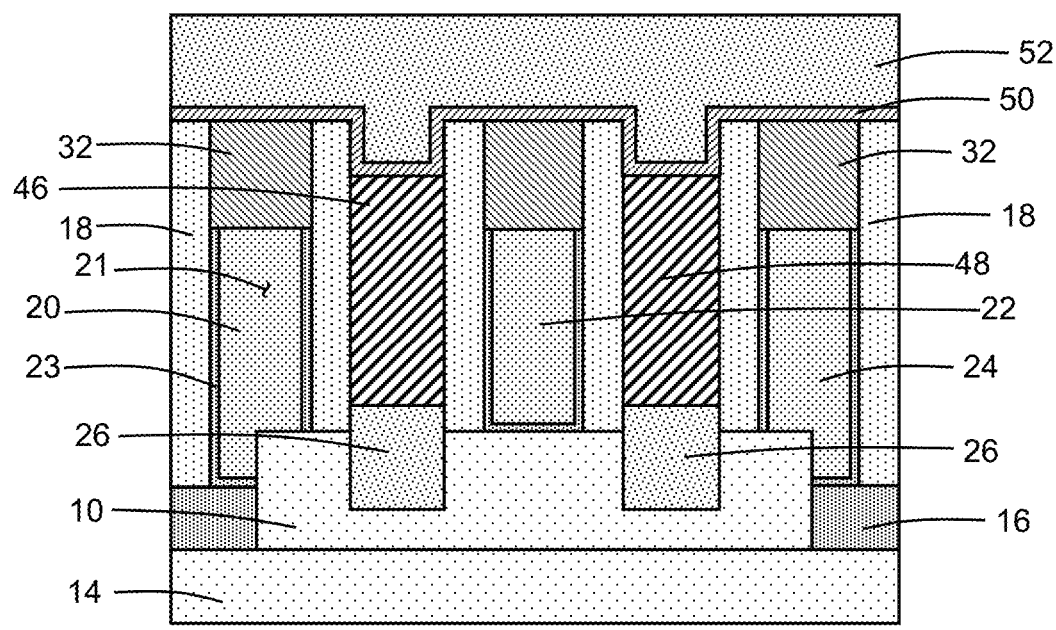
Figure 8B:
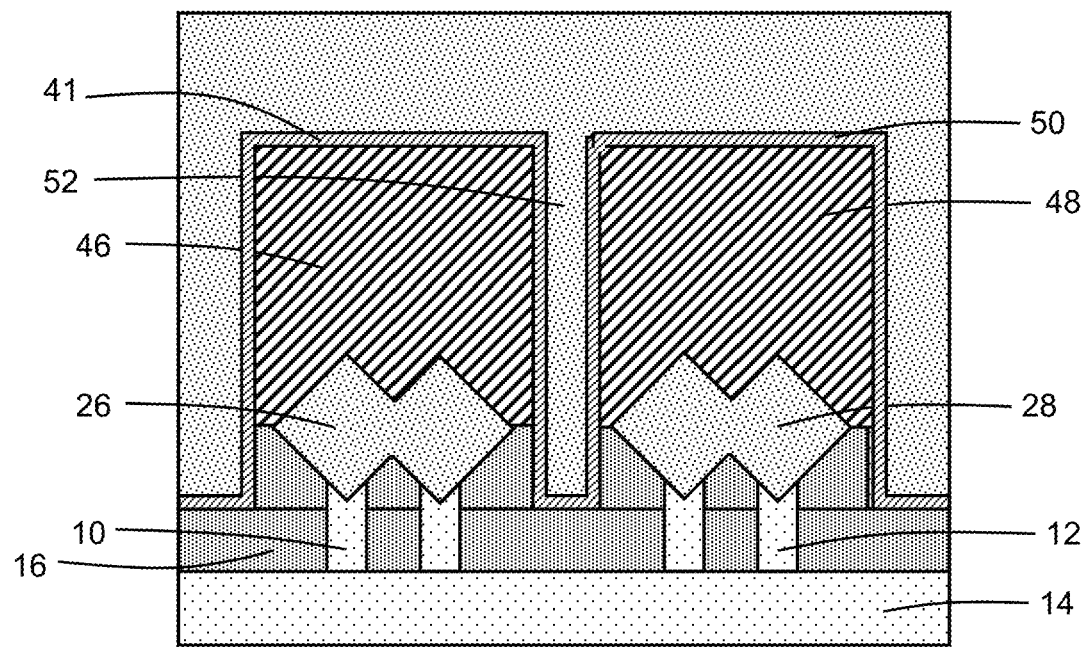

With reference to FIGS. 8, 8A, 8B in which like reference numerals refer to like features in FIGS. 7, 7A, 7B and at a subsequent fabrication stage of the processing method, a dielectric liner 50 is formed inside the cavities 44 and recesses 45 that covers the exposed trench isolation region 16, the sidewall spacers 18, the gate caps 32, and contacts 46, 48. The dielectric liner 50 may be a conformal layer that is composed of a dielectric material containing carbon, such as SiCO, deposited by, for example, atomic layer deposition. The dielectric liner 50 includes sections that are arranged directly over the top surface 47 of the recessed contacts 46, 48 and the trench isolation region 16, and other sections that are arranged adjacent to the sidewalls of the sidewall spacers 18. The dielectric liner 50 may be laterally arranged between the sidewall spacers 18 to fully cover each of the contacts 46, 48.

A dielectric layer 52 is deposited over the dielectric liner 50. The dielectric layer 52 includes portions that are located in the cavities 44 and other portions that are located in the recesses 45 over the dielectric liner 50. The portions of the dielectric layer 52 may be in direct contact with the sections of the dielectric liner 50. The dielectric liner 50 and dielectric layer 52 collectively replace the sections of the interlayer dielectric layer 30 that were removed to open the cavities 44. The dielectric liner 50 and dielectric layer 52 also collectively refill the recesses 45 generated by the recessing of the contacts 46, 48. Sections of the dielectric liner 50 are arranged between portions of the dielectric layer 52 and the contacts 46, 48.

The dielectric layer 52 may be composed of a dielectric material that is non-conformally deposited as a blanket layer by, for example, chemical vapor deposition. In an embodiment, the dielectric layer 52 is composed of a low-k dielectric material having a lower dielectric constant than the material of the interlayer dielectric layer 30. In an embodiment, the dielectric layer 52 is composed of a low-k dielectric material having a lower dielectric constant (i.e., permittivity) than the dielectric material of the dielectric liner 50. In an embodiment, the low-k dielectric material contained in the dielectric layer 52 may have a dielectric constant (i.e., permittivity) that is less than the dielectric constant (i.e., 3.9) of silicon dioxide. In an embodiment, the low-k dielectric material contained in the dielectric layer 52 may have a dielectric constant of about three (3). In an embodiment, the low-k dielectric material contained in the dielectric layer 52 may be SiOCN. In an embodiment, the low-k dielectric material contained in the dielectric layer 52 may be SiOCN, and the dielectric liner 50 may contain SiCO. In an embodiment, the low-k dielectric material contained in the dielectric layer 52 may be selected from SiOCN, SiBCN, SiCO, SiOC, SiC, or a combination of two or more of these materials.

Figure 9:
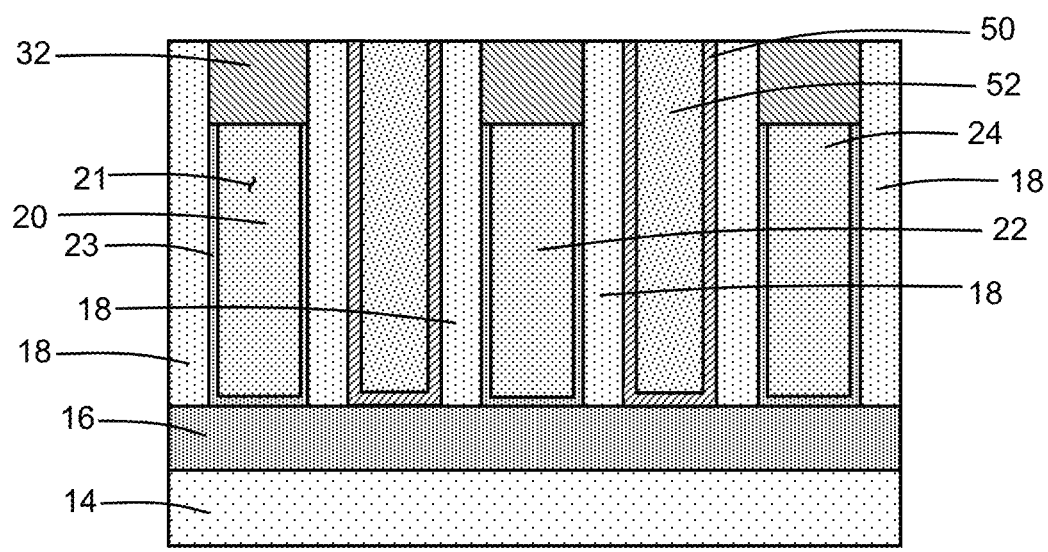
Figure 9A:
Figure 9B:
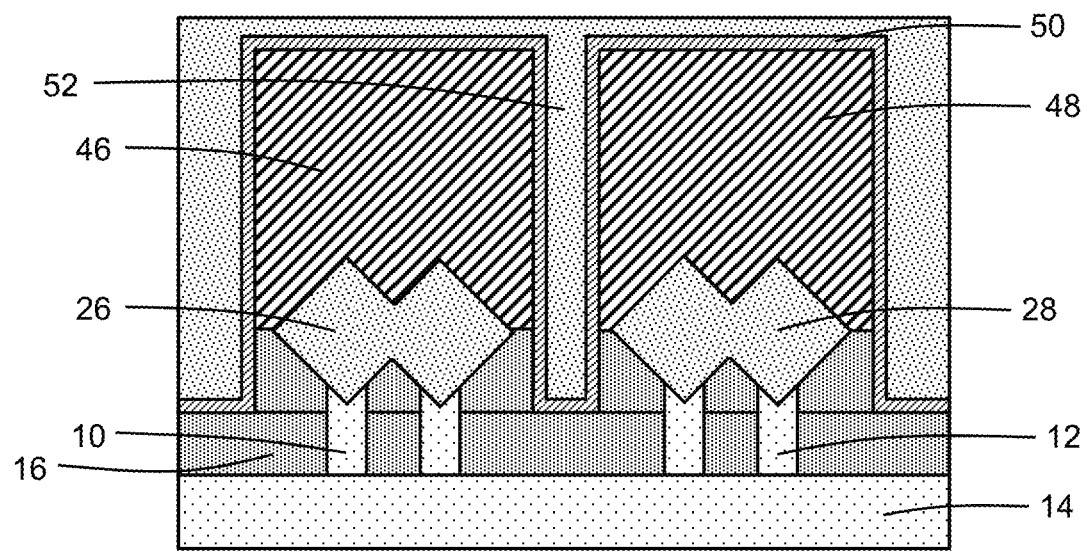

With reference to FIGS. 9, 9A, 9B in which like reference numerals refer to like features in FIGS. 8, 8A, 8B and at a subsequent fabrication stage of the processing method, the dielectric layer 52 is planarized to the top surface 33 of the gate caps 32 with a polishing process, such as a chemical mechanical polishing process. The dielectric liner 50 is also removed by the polishing process from above the sections of the dielectric layer 52 that are arranged between the portions of the capped gate structures 20, 22, 24 arranged over the trench isolation region 16. The prior recessing of the contacts 46, 48 permits portions of the dielectric liner 50 and the dielectric layer 52 to be retained, following the polishing process, in the recesses 45 (FIG. 7A) over the contacts 46, 48. These portions of the dielectric liner 50 may operate to prevent atomic migration of the primary conductor (e.g., cobalt) of the metallization layer 40. Portions of the dielectric liner 50 and the dielectric layer 52 are arranged in the cavities 44 (FIG. 7B) between the semiconductor layers 26 and the semiconductor layers 28.

Figure 10:
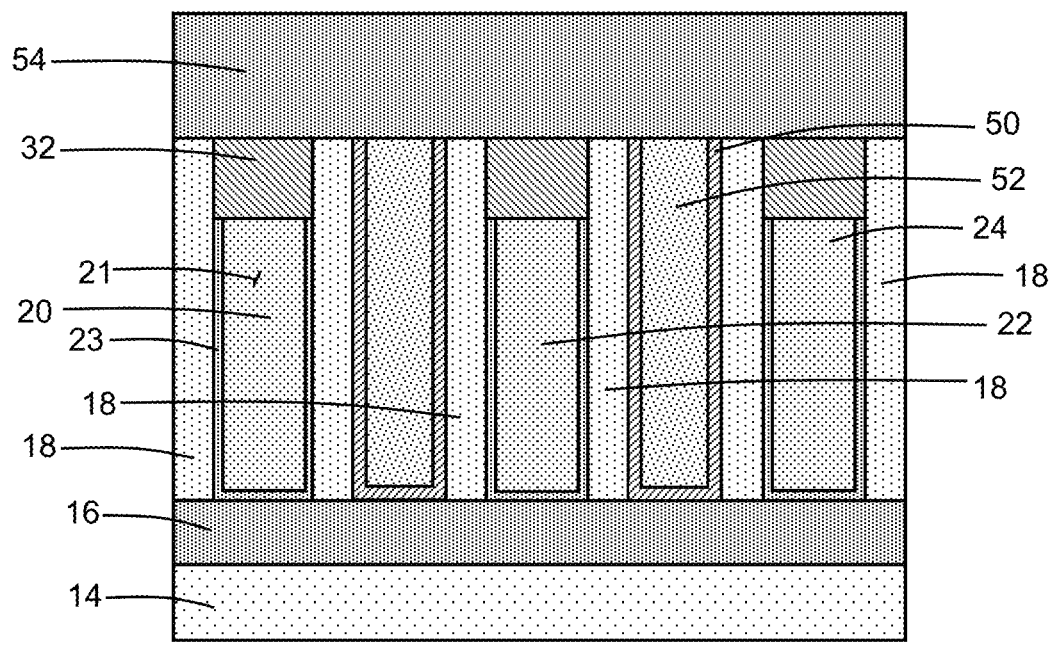
Figure 10A:
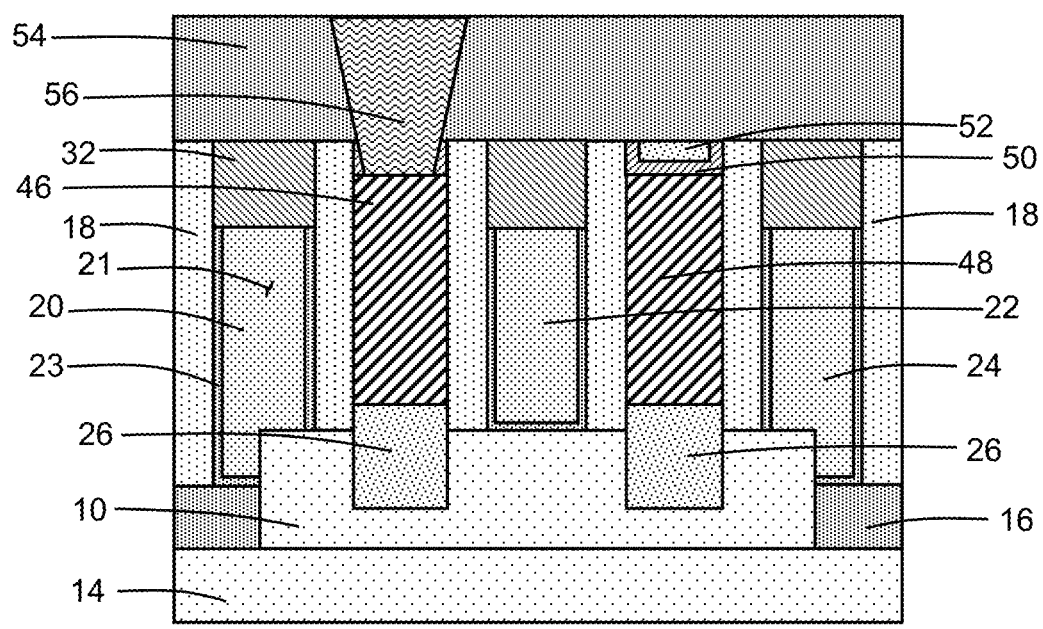
Figure 10B:
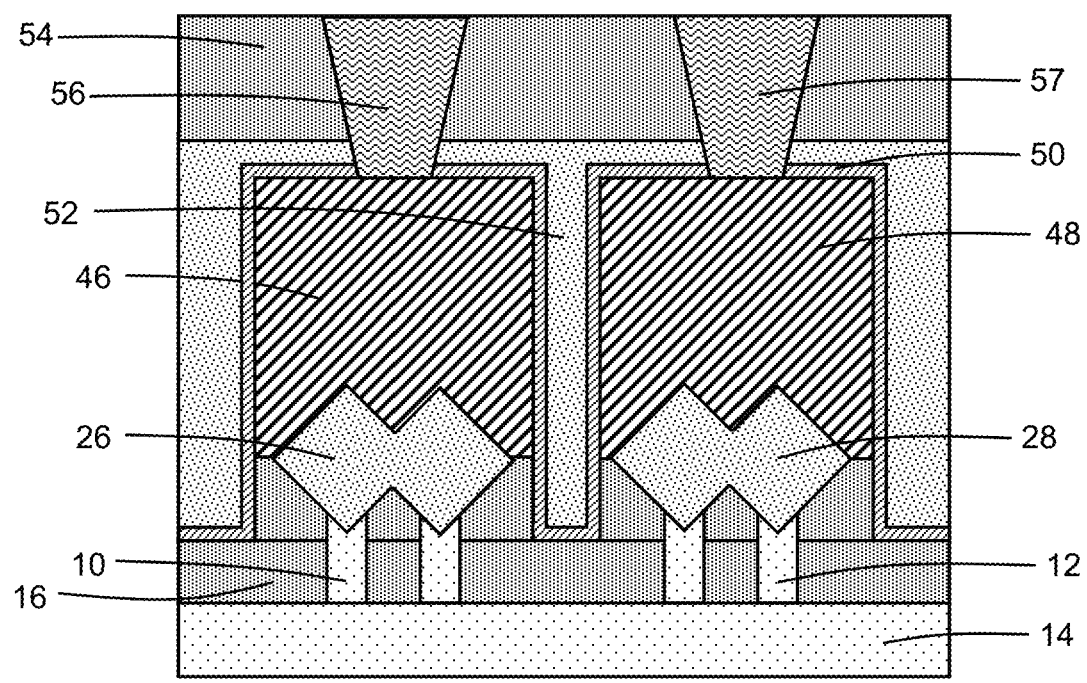

With reference to FIGS. 10, 10A, 10B in which like reference numerals refer to like features in FIGS. 9, 9A, 9B and at a subsequent fabrication stage of the processing method, an interlayer dielectric layer 54 is deposited, and upper contacts 56, 57 are respectively formed in the interlayer dielectric layer 54. The upper contact 56 extends in a vertical direction through the interlayer dielectric layer 54 to the lower contact 46, and the upper contact 57 extends in the vertical direction through the interlayer dielectric layer 54 to the lower contact 48. The upper contacts 56, 57, which may be concurrently formed, may contain a conductor, such as tungsten, deposited by chemical vapor deposition and then planarized by a chemical-mechanical planarization process.

The dielectric material contained in the dielectric liner 50 functions to reduce migration by atomic diffusion from the primary conductor in the lower contacts 46, 48 into overlying structures, such as the overlying interlayer dielectric layer 54. The dielectric material contained in the dielectric layer 52 has a lower dielectric constant than the sections of the interlayer dielectric layer 30 that were removed preceding the deposition of the dielectric layer 52, which may operate to reduce device capacitance. For example, silicon dioxide contained in the interlayer dielectric layer 30 may be replaced by a low-k dielectric material contained in the dielectric layer 52.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a first field-effect transistor including a first source/drain region, a first gate structure, and a first sidewall spacer adjacent to the first gate structure;
    a first contact over the first source/drain region;
    a second field-effect transistor including a second source/drain region, a second gate structure, and a second sidewall spacer adjacent to the second gate structure;
    a second contact over the second source/drain region;
    a conformal layer having a first section arranged over the first contact and a second section arranged over the second contact and
    a dielectric layer including a first portion laterally arranged between the first contact and the second contact,
    wherein the first contact is laterally arranged between the first sidewall spacer and the second sidewall spacer, the first sidewall spacer and the second sidewall spacer each project above the first contact, and the first section of the conformal layer is arranged between the first sidewall spacer and the second sidewall spacer over the first contact.

2. The structure of claim 1 wherein the conformal layer is comprised of a carbon-containing dielectric material.

3. The structure of claim 1 wherein the dielectric layer includes a second portion arranged over the first section of the conformal layer, and the dielectric layer includes a third portion arranged over the second section of the conformal layer.

4. The structure of claim 3 wherein the second portion of the dielectric layer is in direct contact with the first section of the conformal layer, and the third portion of the dielectric layer is in direct contact with the second section of the conformal layer.

5. The structure of claim 1 further comprising:
    a trench isolation region arranged laterally between the first source/drain region and the second source/drain region,
    wherein the first portion of the dielectric layer is arranged over the trench isolation region.

6. The structure of claim 5 wherein the first gate structure has a section arranged over the trench isolation region, the second gate structure has a section arranged over the trench isolation region, and the first portion of the dielectric layer is laterally arranged between the section of the first gate structure and the section of the second gate structure.

7. The structure of claim 5 wherein the first field-effect transistor includes a first semiconductor fin having an upper portion and a lower portion, the second field-effect transistor includes a second semiconductor fin having an upper portion and a lower portion, and the trench isolation region is arranged between the lower portion of the first semiconductor fin and the lower portion of the second semiconductor fin.

8. A method comprising:
    forming a first source/drain region of a first field-effect transistor;
    forming a first gate structure of the first field-effect transistor;
    forming a first sidewall spacer adjacent to the first gate structure;
    forming a second source/drain region of a second field-effect transistor;
    forming a second gate structure of the second field-effect transistor;
    forming a second sidewall spacer adjacent to the second gate structure;
    forming a first contact arranged over the first source/drain region and a second contact arranged over the second source/drain region;
    forming a conformal layer having a first section arranged over the first contact and a second section arranged over the second contact; and
    forming a dielectric layer that includes a first portion laterally arranged between the first contact and the second contact,
    wherein the dielectric layer is comprised of a low-k dielectric material, the first contact is laterally arranged between the first sidewall spacer and the second sidewall spacer, the first sidewall spacer and the second sidewall spacer each project above the first contact, and the first section of the conformal layer is arranged between the first sidewall spacer and the second sidewall spacer over the first contact.

9. The method of claim 8 wherein the first field-effect transistor includes a first semiconductor fin, the second field-effect transistor includes a second semiconductor fin, the first source/drain region is epitaxially grown from the first semiconductor fin, and the second source/drain region is epitaxially grown from the second semiconductor fin, and further comprising:

forming a trench isolation region arranged between a lower portion of the first semiconductor fin and a lower portion of the second semiconductor fin, wherein the first portion of the dielectric layer is arranged over the trench isolation region.

10. The method of claim 8 wherein the first contact and the second contact are formed in respective trenches etched in an interlayer dielectric layer, a section of the interlayer dielectric layer between the first contact and the second contact, and further comprising:

selectively depositing a first metal cap over the first contact and a second metal cap over the second contact; and after selectively depositing the first metal cap over the first contact and the second metal cap over the second contact, removing the section of the interlayer dielectric layer to define a cavity laterally between the first contact and the second contact, wherein the first portion of the dielectric layer is formed in the cavity.

11. The method of claim 8 wherein the conformal layer is comprised of a carbon-containing dielectric material.

12. The method of claim 11 further comprising:

before forming the conformal layer, recessing the first contact and the second contact to form a first recess over the first contact and a second recess over the second contact, wherein the first section of the conformal layer is arranged in the first recess, and the second section of the conformal layer is arranged in the second recess.

13. The method of claim 12 wherein the dielectric layer includes a second portion arranged over the first section of the conformal layer, and the dielectric layer includes a third portion arranged over the second section of the conformal layer.

14. The structure of claim 1 wherein the dielectric layer is comprised of a first low-k dielectric material.

15. The structure of claim 14 wherein the conformal layer is comprised of a second low-k dielectric material.

16. The structure of claim 15 wherein the first low-k dielectric material has a first permittivity, the second low-k dielectric material has a second permittivity, and the first permittivity is less than the second permittivity.

17. The structure of claim 1 wherein the first section of the conformal layer fully covers the first contact.

18. The structure of claim 1 wherein the first field-effect transistor includes a semiconductor fin, and the first source/drain region comprises a semiconductor layer on the semiconductor fin.

19. The structure of claim 1 wherein the first contact has a top surface, the first field-effect transistor includes a gate cap having a top surface, and the top surface of the first contact is arranged in a vertical direction below the top surface of the gate cap.

20. The structure of claim 2 wherein the first contact and the second contact are comprised of cobalt.

* * * * *